US011860553B2

(12) United States Patent
Koolmees et al.

(10) Patent No.: US 11,860,553 B2
(45) Date of Patent: Jan. 2, 2024

(54) ASSEMBLY COMPRISING A CRYOSTAT AND LAYER OF SUPERCONDUCTING COILS AND MOTOR SYSTEM PROVIDED WITH SUCH AN ASSEMBLY

(71) Applicant: ASML Netherlands B.V., Veldhoven (NL)

(72) Inventors: Hessel Bart Koolmees, Eindhoven (NL); Johannes Petrus Martinus Bernardus Vermeulen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/100,400

(22) Filed: Jan. 23, 2023

(65) Prior Publication Data

US 2023/0161271 A1   May 25, 2023

Related U.S. Application Data

(62) Division of application No. 15/734,882, filed as application No. PCT/EP2019/061897 on May 9, 2019, now Pat. No. 11,592,756.

(30) Foreign Application Priority Data

Jun. 5, 2018   (EP) .................................... 18175898

(51) Int. Cl.
*G03F 7/00*       (2006.01)
*H02K 3/02*       (2006.01)
(Continued)

(52) U.S. Cl.
CPC ........... *G03F 7/70775* (2013.01); *H02K 3/02* (2013.01); *H02K 41/02* (2013.01); *H02K 55/00* (2013.01)

(58) Field of Classification Search
CPC ...... G03F 7/70775; H02K 3/02; H02K 41/02; H02K 55/00
See application file for complete search history.

(56) References Cited

U.S. PATENT DOCUMENTS

| 5,175,975 A | 1/1993 | Benson et al. |
| 6,020,964 A | 2/2000 | Loopstra et al. |
| (Continued) | | |

FOREIGN PATENT DOCUMENTS

| EP | 2 034 595 A2 | 3/2009 |
| JP | H 11-330216 A | 11/1999 |
| (Continued) | | |

OTHER PUBLICATIONS

International Search Report and Written Opinion of the International Searching Authority directed to related International Patent Application No. PCT/EP2019/061897, dated Oct. 30, 2019; 13 pages.

(Continued)

*Primary Examiner* — Hung V Nguyen
(74) *Attorney, Agent, or Firm* — Sterne, Kessler, Goldstein & Fox P.L.L.C.

(57) ABSTRACT

The invention provides an assembly having a cryostat and a flat coil layer of superconducting coils for use with a magnetic levitation and/or acceleration motor system of a lithographic apparatus. The cryostat has two insulation coverings. The coil layer is arranged between the two coverings. The coverings each have an inner plate configured to be cryocooled and an outer plate parallel to the inner plate, and an insulation system with a vacuum layer between the inner and outer plate. The insulation system of said covering has a layers of circular bodies, the central axes of these bodies extending perpendicular to the inner and outer plate, and is configured to provide a layer of point contacts between two (Continued)

layers of circular bodies or between a layer of circular bodies and the inner and/or outer plate.

20 Claims, 7 Drawing Sheets

(51) Int. Cl.
   *H02K 41/02* (2006.01)
   *H02K 55/00* (2006.01)
   *G03F 7/20* (2006.01)

(56) References Cited

U.S. PATENT DOCUMENTS

| | | |
|---|---|---|
| 6,952,253 B2 | 10/2005 | Lof et al. |
| 7,355,308 B2 | 4/2008 | Hazelton |
| 7,800,258 B2 | 9/2010 | Ito |
| 9,778,579 B2 | 10/2017 | Pharand et al. |
| 2007/0058173 A1 | 3/2007 | Holzapfel |
| 2010/0090545 A1 | 4/2010 | Binnard et al. |
| 2014/0273536 A1 | 9/2014 | Nishiyama |
| 2018/0067397 A1 | 3/2018 | Aoki |
| 2021/0223706 A1 | 7/2021 | Koolmees et al. |

FOREIGN PATENT DOCUMENTS

| | | |
|---|---|---|
| JP | 2000-153455 A | 6/2000 |
| JP | 2000-170280 A | 6/2000 |
| JP | 2009-060773 A | 3/2009 |
| JP | 2010-161839 A | 7/2010 |
| JP | 2010-272659 A | 12/2010 |
| JP | 2014-157899 A | 8/2014 |
| KR | 100750063 B1 | 8/2007 |
| WO | WO 00/03301 A2 | 1/2000 |
| WO | WO 2013/112759 A1 | 8/2013 |

OTHER PUBLICATIONS

International Preliminary Report on Patentability directed to International Patent Application No. PCT/EP2019/061897, dated Dec. 8, 2020; 9 pages.

ASSEMBLY COMPRISING A CRYOSTAT AND LAYER OF SUPERCONDUCTING COILS AND MOTOR SYSTEM PROVIDED WITH SUCH AN ASSEMBLY

CROSS-REFERENCE TO RELATED APPLICATIONS

This application is Divisional of U.S. application Ser. No. 15/734,882, filed on Dec. 3, 2020, which is a 371 National Stage Entry of PCT/EP2019/061897, filed on May 9, 2019, which claims priority of EP application 18175898.8 which was filed on Jun. 5, 2018 and which is incorporated herein in its entirety by reference.

FIELD

The present invention relates to an assembly for use in a magnetic levitation and/or acceleration motor system of a lithographic apparatus. The assembly comprising a cryostat and a layer of superconducting coils.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In a lithographic apparatus a patterning device is subjected to a radiation beam. Whilst passing through the patterning device, a pattern is imparted to this radiation beam. Subsequently, the radiation beam with imparted pattern passes through a projection system, which projects the imparted pattern onto a substrate. In order to provide the substrate with a desired pattern, both the patterning device and the substrate are moved with respect to the projection system as well as with respect to each other. For this purpose linear and/or planar motor systems are used based on current conducting coils and permanent magnets at room temperature or higher due to heat developed by the coils. Linear and planar motor systems typically have a stator part and a mover part which is movable in controlled manner with respect to the stator part by manipulating the current through the current conducting coils.

SUMMARY

Analytical relations show that the magnetic field density in the coils of the mover of a linear or planar motor system can be improved a factor 4-5 by using superconducting electromagnets at a temperature of 4K. In practise superconductors are available which are superconducting at higher cryogenic temperatures in the range of 70K to 150K. In order to put this superconducting electro magnets into practice a thermal insulation from the cryogenic temperature required to room temperature is needed which has to fit within a small stack height. Otherwise the distance between the coils of the mover and the superconducting magnets increases due to the insulation to an extent that the increase of magnetic field density in the coils is lost. There is therefore a need for a thermal insulation layer of small height.

Linear and planar motor systems used in a lithographic apparatus are typically used based on current conducting coils and magnets. Linear and planar motor systems used in a lithographic apparatus further typically have a stator part and a mover part which is movable in controlled manner with respect to the stator part by manipulating the current through the current conducting coils. It is realized that a) the magnets can be provided in the stator part and the current conducting coils in the mover part or, the other way around, the magnets can be provided in the mover part and the current conducting coils in the stator part, on the one hand, and that b) not only the magnets may be superconducting magnets having superconducting coils but additionally or alternatively the current conducting coils may be superconducting coils, on the other hand.

Taking all this into account, the present invention has as its object to provide an assembly comprising a cryostat and a coils layer of superconducting coils, the coil layer being flat and configured for use in or with a magnetic levitation and/or acceleration motor system of a lithographic apparatus.

According to a first aspect of the invention, there is provided an assembly comprising a cryostat and a coil layer of superconducting coils, wherein the coil layer is configured for use in or with a magnetic levitation and/or acceleration motor system of a lithographic apparatus, is flat and defines two opposing layer faces.

The coil layer may be configured as a stator part of a magnetic levitation and/or acceleration motor system and/or as a mover part of a magnetic levitation and/or acceleration motor system. Further the coil layer may be wired for alternating current operation and/or may be an array of electromagnets wired for direct current operation.

The magnetic levitation and/or acceleration motor system may be a linear motor system or a planar motor system.

The cryostat comprises two insulation coverings. The coil layer and two insulation coverings are arranged in a sandwich manner, with the coil layer arranged between the two insulation coverings and each of the two opposing layer faces of the coil layer covered by one of the insulation coverings in order to be able to keep the coil layer at a cryogenic condition required superconductivity of the coils.

The insulation coverings each comprise: an inner plate and an outer plate parallel to the inner plate, the inner plate being arranged between the outer plate and the coil layer, and an insulation system arranged between the inner plate and the outer plate. The inner plate and/or outer plate may be from a stainless steel alloy.

The insulation system is configured to have a vacuum layer. A vacuum layer in the insulation system reduces the thermal conductivity between the inner plate and outer plate. This vacuum may be a vacuum of $10^{-3}$ Pa or lower. When the mover is in an ambient of normal air pressure, this results in that the insulation covering has to be able to withstand a pressure difference of 1 bar. Taking into account that in planar motor systems for moving the substrate in a lithographic apparatus, the stator typically has a surface in the order of 1 meter by 2 meter, or larger, this means that the thermal insulation must be able to withstand large forces.

The inner plates are configured for being cryocooled in order to bring and maintain the coil layer at cryogenic condition.

The insulation system of one or both said insulation coverings:
- comprises, in the vacuum layer, one or more layers of at least partly circular bodies each defining an at least partly circular contour and a central axis extending through a center of the circular contour as well as perpendicular to the circular contour, the central axes of the bodies of each layer of circular bodies extending perpendicular to the inner and outer plate, and
- is configured to provide at least one layer of point contacts between two said layers of circular bodies or between a said layer of circular bodies and the inner and/or outer plate such that each possible thermal conductive path between the inner and outer plate has to pass, at some place, through at least one point contact.

The layers of circular bodies are arranged between the inner and outer plate and support the inner plate on the outer plate—when the inner plate lies above the outer plate—or the outer plate on the inner plate—when the outer plate lies above the inner plate—. Circular bodies have a high load-bearing capacity, on the one hand, whilst providing a point contact, on the other hand. As a point contact has a very small contact surface, the thermal conductivity through the point contact is very low. With one or more layers of circular bodies having their central axes perpendicular to the inner and outer plate and configured to provide at least one layer of point contacts it is ensured that each possible thermal conductive path between the inner and outer plate has to pass, at some place, through at least one point contact. This results in an insulation covering having minimal thermal conductivity, on the one hand, and high load bearing capacity on the other hand.

The circular bodies may be fully circular or partly circular having a partly circular contour extending over an angle of 180° or less, like 60-120°. The circular bodies may be spherical bodies, like spheres and/or half-spheres, and/or straight cylindrical bodies, like cylinders and/or half-cylinders. For example, in case of half-spheres or half-cylinders, the half-spheres respectively half-cylinders may be glued onto the face of the inner plate facing the outer plate and/or onto the face of the outer plate facing the inner plate, and stacked onto each other resulting in a said layer of point contacts between half-spheres, between half-cylinders, or between half-spheres and half-cylinders.

Defining the diameter of a said circular body as twice the radius from the center of the circular contour to the circular contour, the diameter of the at least partly circular bodies may, according to a further embodiment, be smaller than 7 mm, such as smaller than 5 mm. The diameter may be in the range of 0.1 to 5 mm, such as in the range of 0.5 to 4 mm. Circular bodies with such a diameter are readily available, for example as spheres for ball bearings or as cylinders for needle bearings or as wires. Further, circular bodies of such diameter allow insulation coverings with a thickness—perpendicular to the inner and outer plate—of less than 10 mm. Even a thickness much lower is possible and/or multiple layers of point contact are possible with smaller diameters whilst still keeping the total thickness of the insulation covering below 10 mm. The thickness may for example be at most 7-8 mm.

The point contacts, in a said layer of point contacts, may, according to a further embodiment, be arranged with a pitch of 5-20 mm, for example a pitch of 10-15 mm.

According to an embodiment of the assembly, the circular bodies may be made from a material chosen from one or more of the group of: zirconia, Kevlar, Kevlar composites, Kevlar fiber composites, glass, glass composites, glass fiber composites, and titanium alloys. These materials are commercially available in the form of wires and spheres, have a large strength and low thermal conductivity.

According to an embodiment of the assembly, the circular bodies may be made from a material having a ratio of the Young modulus with respect to the integral of the thermal conductivity coefficient over the temperature range of 4K to 80K, which is at least 1 N/Wm, such as at least 1.5 N/Wm. Expressed in a formula, this ratio is:

$$E/(\int_4^{80} \lambda(T)dT) \geq 1 \text{ N/Wm, such as } E/(\int_4^{80} \lambda(T)dT) \geq 1 \text{ N/Wm} > 1.5 \text{ N/Wm}$$

According to a further embodiment of the assembly, at least one said layers of spherical bodies may comprise spheres and a spacer plate provided with a pattern of circular through holes for accommodating the spheres, each through hole having a diameter configured to contact a said sphere such that the spacer plate is supported by the spheres, wherein the spacer plate is arranged parallel to the inner plate and outer plate. Viewed perpendicular to the spacer plate, the spacer plate is arranged at a distance from each of opposing ends of the spheres. This spacer plate prevents the spheres from rolling away by keeping them at locations determined by the through holes. In this embodiment the spacer plate may be configured for being cooled, like cryocooled, at a temperature between a temperature of the inner plate and a temperature of the outer plate. The spacer plate than additionally serves as insulation shield increasing the thermal insulation considerable. The diameter of the through holes may in this embodiment for example be in the range of 70-100%, such as 90-100%, of the diameter of the spheres. Further, in this embodiment, the thermal expansion coefficient of the spacer plate may be larger than the thermal expansion coefficient of the spheres such that when the spacer plate and spheres are cooled down a shrunk connection between the spacer plate and spheres is obtained in the through holes. This shrunk connection may provide a sealing closing the through hole with respect to the sphere, which improves the insulation capacity of the insulation system. For this purpose, the spacer plate may be made from aluminum or an aluminum alloy.

According to a further embodiment of the assembly, the assembly may comprise a multiple of said layers of spherical bodies, wherein between adjacent ones of said layers of spherical bodies a separation plate is arranged which provides on each side an additional layer of point contacts between the separation plate and spherical bodies. In this embodiment, the separation plate may be configured for being cooled, like cryocooled, at a temperature between a temperature of the inner plate and a temperature of the outer plate.

According to another further embodiment of the assembly, said one or more layers of circular bodies may comprise at least one set of two layers of straight cylindrical bodies, such as cylinders and/or half-cylinders; wherein the cylindrical bodies of a first of said two layers are arranged parallel to each other with a spacing between adjacent cylindrical bodies and the cylindrical bodies of a second of said two layers are arranged parallel to each other with a spacing between adjacent cylindrical bodies; and wherein the first layer and second layer are stacked directly onto each other with the cylindrical bodies of the first layer crosswise with respect to the cylindrical bodies of the second layer to provide, between the cylindrical bodies of the first layer and the cylindrical bodies of the second layer, a said layer of point contacts. In this embodiment, the cylindrical bodies may be wires. Crosswise may be at an angle of 90° or at any other angle, like an angle in the range of 30° to 90°, for example an angle of about 60°.

According to a further embodiment of the assembly, the assembly may further comprise a cryocooler system configured for cryocooling the inner plates.

According to a further embodiment of the assembly, the assembly may further comprise a vacuum system configured to provide in the vacuum layer a vacuum of $10^{-3}$ Pa or lower.

According to a further aspect, the invention relates to a lithographic apparatus provided with an assembly according to the invention. Such a lithographic apparatus may comprise a mask support constructed to support a patterning device, a first positioner configured to position the mask support with respect to the first positioner, a substrate support constructed to hold a substrate, a second positioner configured to position the substrate support with respect to the second positioner, and a projection system configured to project a pattern imparted to a radiation beam by the patterning device onto a target position on the substrate; wherein one or more of the items 'the mask support, the first positioner, the substrate support, and the second positioner' are provided with an assembly according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
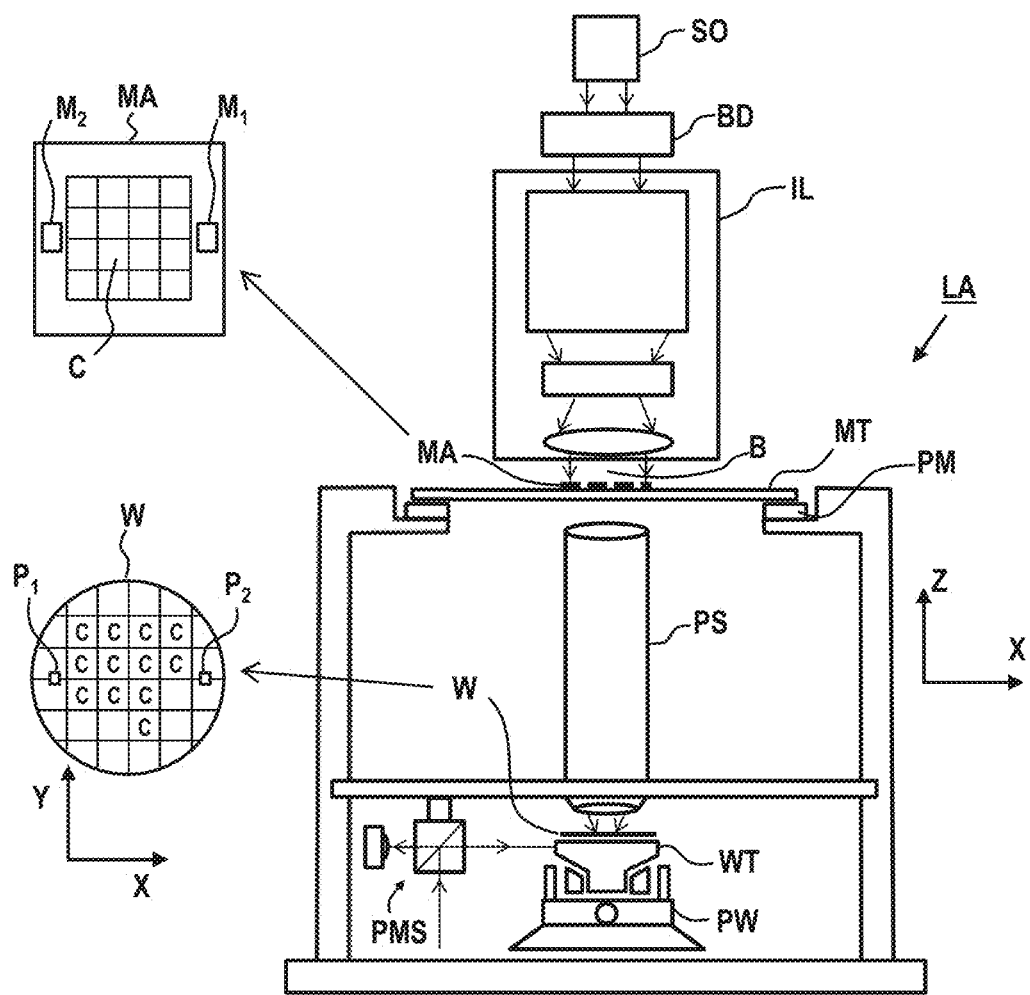
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

The assembly according to the invention—which will be elucidated further below—may be used in the first positioner PM and/or mask support MT. Further, in addition or alternatively the assembly according to the invention—which will be elucidated further below—may be used in the second positioner PW and/or substrate support WT.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection systems, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W. Also in case of two or more substrate supports WT, the assembly according to the invention—which will be elucidated further below—may be used in the second positioner PW and/or the two or more substrate supports.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
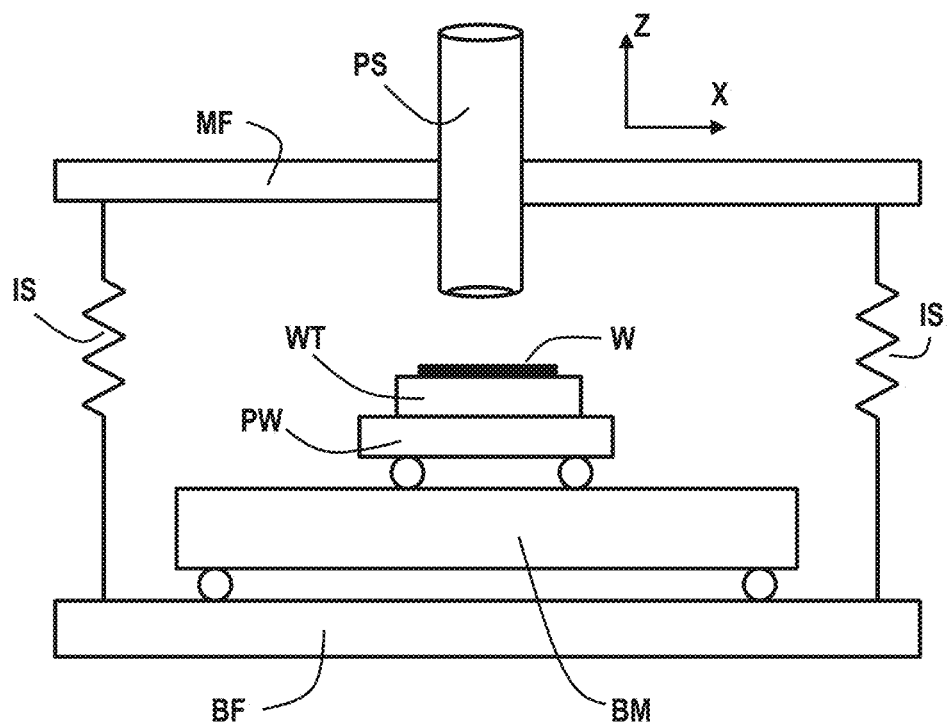
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a part of a planar motor system to levitate or accelerate the substrate support WT above and/or relative to the balance mass BM. This planar motor system may be a magnetic levitation and/or acceleration motor system provided with an assembly according to the invention—which will be elucidated further below —. In another embodiment, the second positioner PW is supported by the base frame BF. For example, wherein the second positioner PW comprises a stator of linear motor and wherein the second positioner PW comprises a bearing, like a gas bearing, to levitate the substrate support WT above the base frame BF. According to another example, the second positioner may comprise a linear motor system provided with an assembly according to the invention—which will be elucidated further below—.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator of the first positioner and/or second positioner may be a linear actuator to provide a driving force along a single axis, for example the y-axis. This linear actuator may be provided with an assembly according to the invention. Multiple linear actuators, which may be provided with an assembly according to the invention, may be applied to provide driving forces along multiple axis. The actuator may be a planar actuator to provide a driving force along multiple axis. This planar actuator may be provided with an assembly according to the invention. For example, the planar actuator may be arranged to move the substrate support WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
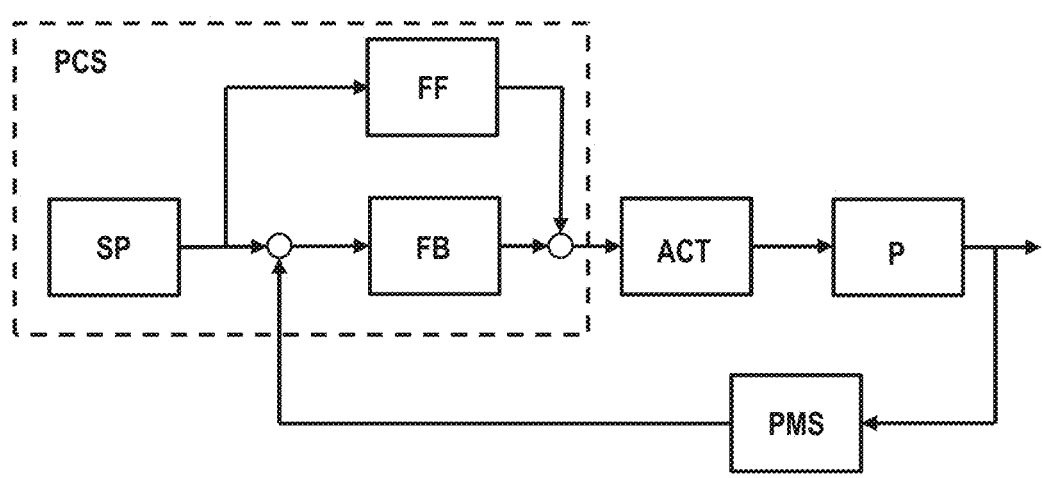
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
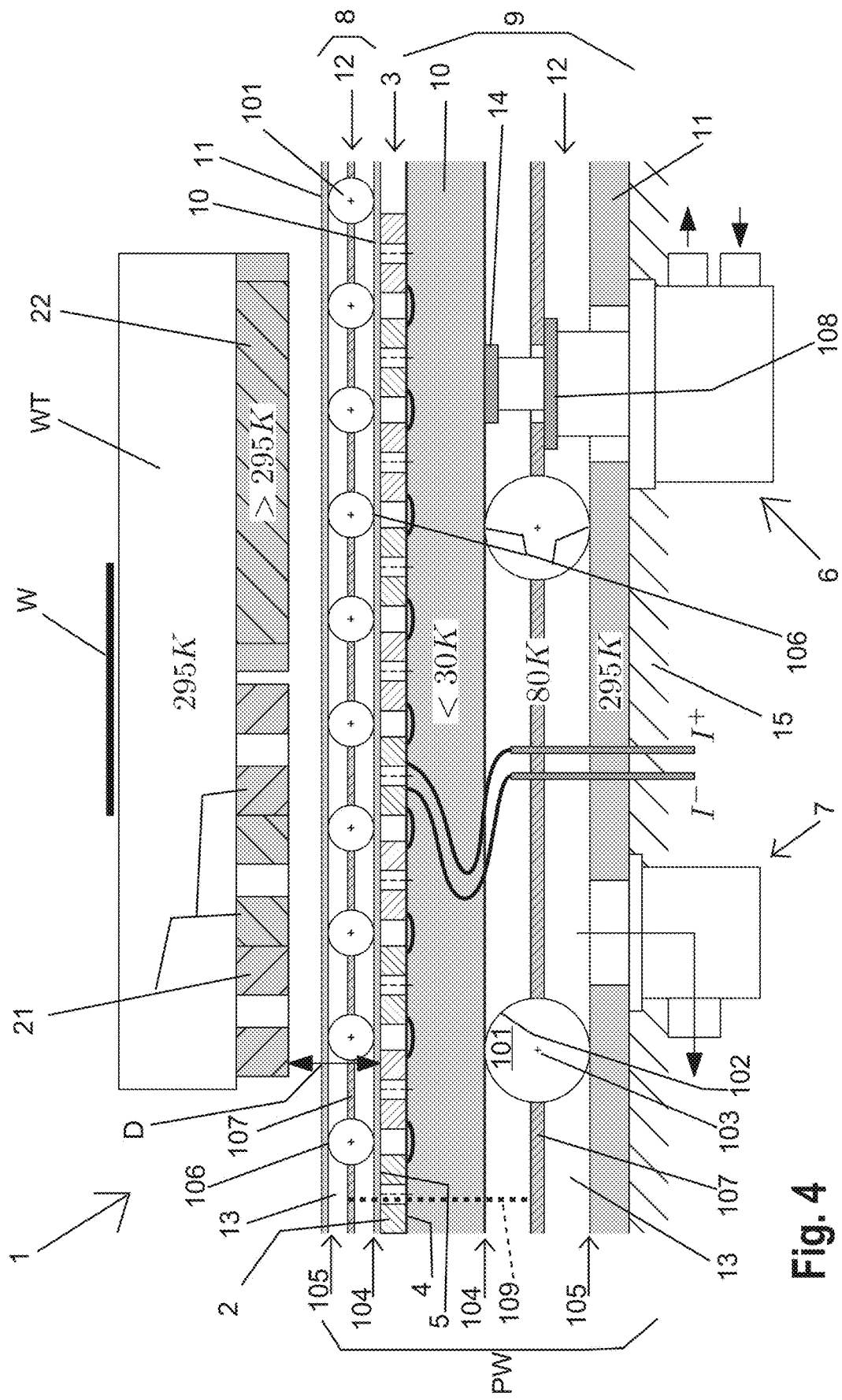
FIG. 4 schematically depicts a cross section of a planar motor system provided with an embodiment of the assembly according to the invention.

FIG. 4 shows, schematically, a side cross-section of magnetic levitation and/or acceleration motor system 1 according to the invention, which system has a flat coil layer 3 of electromagnets 2 and is provided with an assembly 6, 7, 8, 9 according to the invention. Due to the coil layer 3 being flat, this magnetic levitation and/or acceleration motor system 1 is a linear motor system or planar motor system. The coil layer 3 is flat, because the electromagnets 2 are arranged in a plane. In the example of FIG. 4, it is a planar motor system. In the example shown, this planar motor system 1 is used in the wafer stage of a lithographic apparatus. For this purpose, the substrate W, substrate support WT and second positioner PW are indicated with the same references as used in FIGS. 1-3. In addition or alternatively, the magnetic levitation and/or acceleration motor system 1 according to the invention may also be used as a planar or linear motor system in the mask stage of a lithographic apparatus, in which case the substrate W may be the patterning device MA (e.g. a mask), the substrate support WT may be the mask support MT and the second positioner PW may be the first positioner PM.

Figure 5:
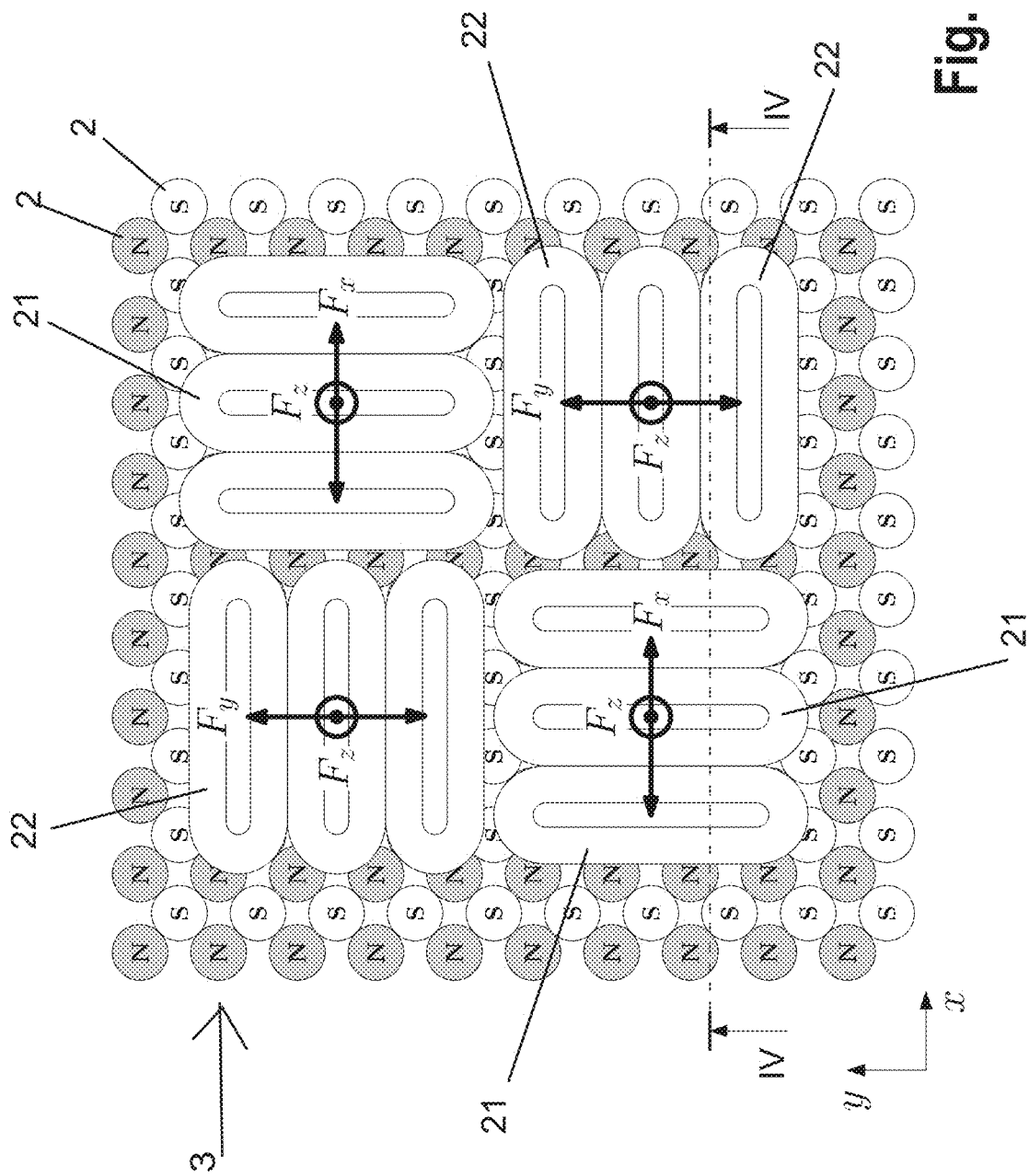
FIG. 5 schematically depicts in top view a planar motor system.

FIG. 5 shows a detail of FIG. 4, which details are shown in FIG. 4 in cross-section according the arrows IV as indicated in FIG. 5.

In the embodiments of FIGS. 4 and 5 the assembly according to the invention is provided in the stator part of the planar motor system 1. The mover part of this planar motor system, in this example indicated as WT, is at its underside provided with a flat layer of conducting coils 21, 22 in which the current can be manipulated by means of a controller in order to control the position of the mover part WT with respect to the stator part PW; 8, 3, 9.

The assembly according to the invention comprises a cryostat 6, 7, 8 and 9 configured to cryocool the superconducting electromagnets 2 in the coil layer 3 at a cryogenic temperature, for example a temperature below 30 K as indicated in FIG. 4. Taking into account that presently there are materials available which are superconducting in the range of 70K to 150K, this temperature may also be higher than 30K.

In the embodiments of FIGS. 4 and 5, the coil layer 3 is a layer of superconducting electromagnets 2. The coil layer is flat and has opposing layer faces 4, 5. In FIG. 4, layer face 4 is the lower face of the coil layer 3 and layer face 5 is the upper face of coil layer 3.

The cryostat comprises a cryocooler system 6, a vacuum system 7, and two insulation coverings 8, 9. The coil layer 3 and two insulation coverings 8, 9 are arranged in a sandwich manner, with the coil layer 3 arranged between the two insulation coverings 8, 9 such that each of the two opposing layer faces 4, 5 is covered by one of the insulation coverings 8, 9.

One of the insulation coverings or both the insulation coverings 8, 9 may each comprise an inner plate 10 and an outer plate 11 parallel to the inner plate 10. The inner plate 10 is closest to the coil layer 3 and arranged between the outer plate 11 and the coil layer 3. One of or both the insulation coverings 8, 9 may further comprise an insulation system 12 arranged between the inner plate 10 and outer plate 11.

The vacuum system is configured to provide a vacuum (layer) 13 in the insulation system.

The cryocooler system is configured for cryocooling the inner plates 10 and is for this purpose at 14 connected with the inner plate 10 of the insulation covering 9. Because the inner plate 10 of the insulation covering 8 is thermally connected with the inner plate 10 of the insulation covering 9, also the inner plate 10 of the insulation covering will be cryocooled. This thermal connection may for example be provided via the magnets 2 or not shown thermal bridges.

According to the invention, the insulation system 12 of one or both said insulation coverings 8, 9 comprises, in the vacuum (layer) 13, one or more layers of at least partly circular bodies 101 each defining an at least partly circular contour 102 and a central axis extending through a center 103 of the circular contour 102 as well as perpendicular to the circular contour 102. The central axes of the circular bodies 101 of each layer of circular bodies extend perpendicular to the inner plate 10 and outer plate 11. In the embodiment as shown in FIG. 4, the at least partly circular bodies are spheres, in this case full-spheres, but these circular bodies may also be half-spheres or straight cylindrical bodies, e.g. full-cylindrical bodies or half-cylindrical bodies. The term 'full-' relates specifically to the outer contour of the circular bodies not to the inner of the circular bodies. The inner of a full-circular bodies may for example be hollow or a full-circular body may have a through bore in order to save weight and/or to reduce the thermal conductivity of the bodies.

The insulation covering 8, 9 according to the invention is furthermore configured to provide at least one layer 104, 105 of point contacts 106 between two said layers of circular bodies 101 or between a said layer of circular bodies 101 and the inner plate 10 and/or outer plate 11. This configuration is such that each possible thermal conductive path between the inner plate 10 and outer plate 11 has to pass, at some place, through at least one point contact 106. This results in an insulation covering having minimal thermal conductivity due to the layer of point contacts, on the one hand, and high load bearing capacity due to the at least partly circular bodies on the other hand. In the example of FIG. 4, there are two layers 104 and 105 of point contacts 106. One layer 105 at the side of the outer plates 11 and one layer 104 at the side of the inner plates.

In the embodiment of FIG. 4, the circular bodies 101 may be (full-)spheres of zirconium with a diameter of 7 mm. These spheres lie between the inner plate 10 and outer plate 11. In a linear motor the vertical distance D between the layer 3 of electro-magnets 2 and the conducting coils 21, 22 is limited. This means that the vertical thickness (in the direction of double arrow D) of especially the insulation covering 8 is to be kept low. With an aluminum inner plate 10 and aluminum outer plate 11 of each 0.75 mm thickness and spheres with a diameter of 7 mm, the total thickness of the insulation covering is about 9 mm. This thickness can easily be reduced by using a thinner inner plate 10 and thinner outer plate 11 and/or by using spheres 101 of smaller diameter. In this respect it is to be noted that zirconium spheres with diameters as from 0.2 mm can be readily obtained in the market against low prices.

Also the insulation covering 9 can be designed very thin, but taking into account that on this side of the layer 3 of superconducting electromagnets 2 space is in general not a real issue, the spheres 101 in the insulation covering 9 can be taken larger than the spheres 101 in the insulation covering 8. The spheres in the insulation covering may for example be in the range of 15-20 mm.

In order to prevent these spheres from rolling away, a spacer plate 107 may be provided. This spacer plate 107 may be provided with a pattern of through holes, each having a diameter in the range of 70-100% of the diameter of the spheres. By using a spacer plate with a thermal expansion coefficient larger than the thermal expansion coefficient of the spheres, a sealing shrunk connection between the spheres 101 and spacer plate 107 is obtained when the inner plate is cryocooled. Further, the spacer plate 107 may be kept at a temperature of in this example about 80 K by the crycooler. For this purpose the crycooler 6 is at 108 connected with the spacer plate 107 of the insulation covering 9 (and/or 8, not shown). The spacer plate 107 then serves as a shield which improves the insulation capacity of the insulation covering 8, 9. In order to cool both the spacer plates 107, the spacer plates 107 are thermally connected by thermal connection 109.

As shown in FIG. 4 by means of the indicated temperatures, the substrate support WT may be at room temperature, the coils 21 and 22 may have a temperature higher than room temperature due to heat development in the coils 21 and 22, and the frame 15 may be at room temperature as well. Further the crycooler cryocools both the inner plates 10 at a cryogenic temperature, which will, according to this example, be below 30K. To improve the insulation, the spacer plates 107 are cooled by the cryocooler to have a temperature between the temperature of the inner plates (in this example <30K) and the temperature of the outer plates (in his example 295K). The temperature of the spacer plates may for example be 80 K.

In the example of FIGS. 4 and 5, the planar motor system according to the invention has a stator part provided with a flat layer of superconducting electromagnets 2 and a mover part provided with a flat layer of normal-conducting coils 21, 22 (which are in general at room temperature or higher when, in use, the coils 21, 22 produce heat), see FIGS. 4 and 5. It is noted that additionally or alternatively the flat layer of coils 21 may, according to the invention, be a flat layer of superconducting coils having on both sides or one side of the flat layer an insulation covering 8, 9 according to the invention with at least partly circular bodies in a vacuum layer. In this case the coil layer 3 may be a coil layer of permanent magnets or normal electromagnets or superconducting electromagnets.

Figure 6:
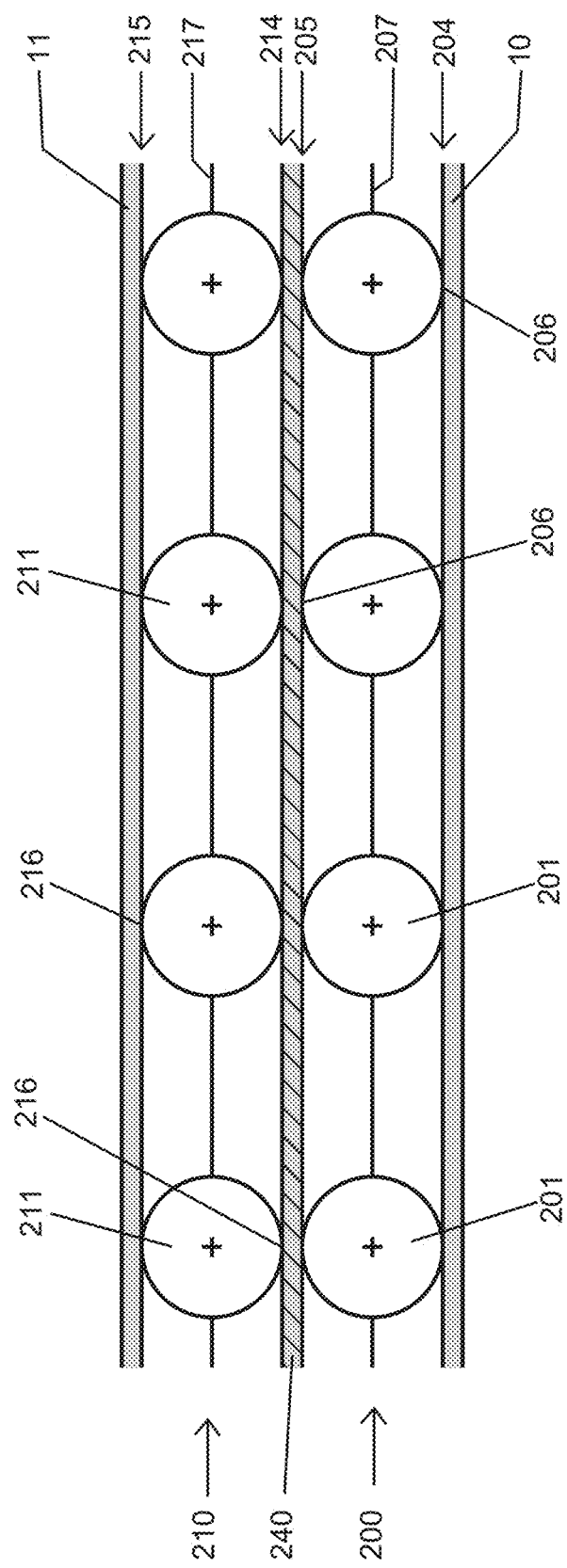
FIG. 6 schematically depicts a second embodiment of an insulation covering of an assembly according to the invention.
Figure 7:
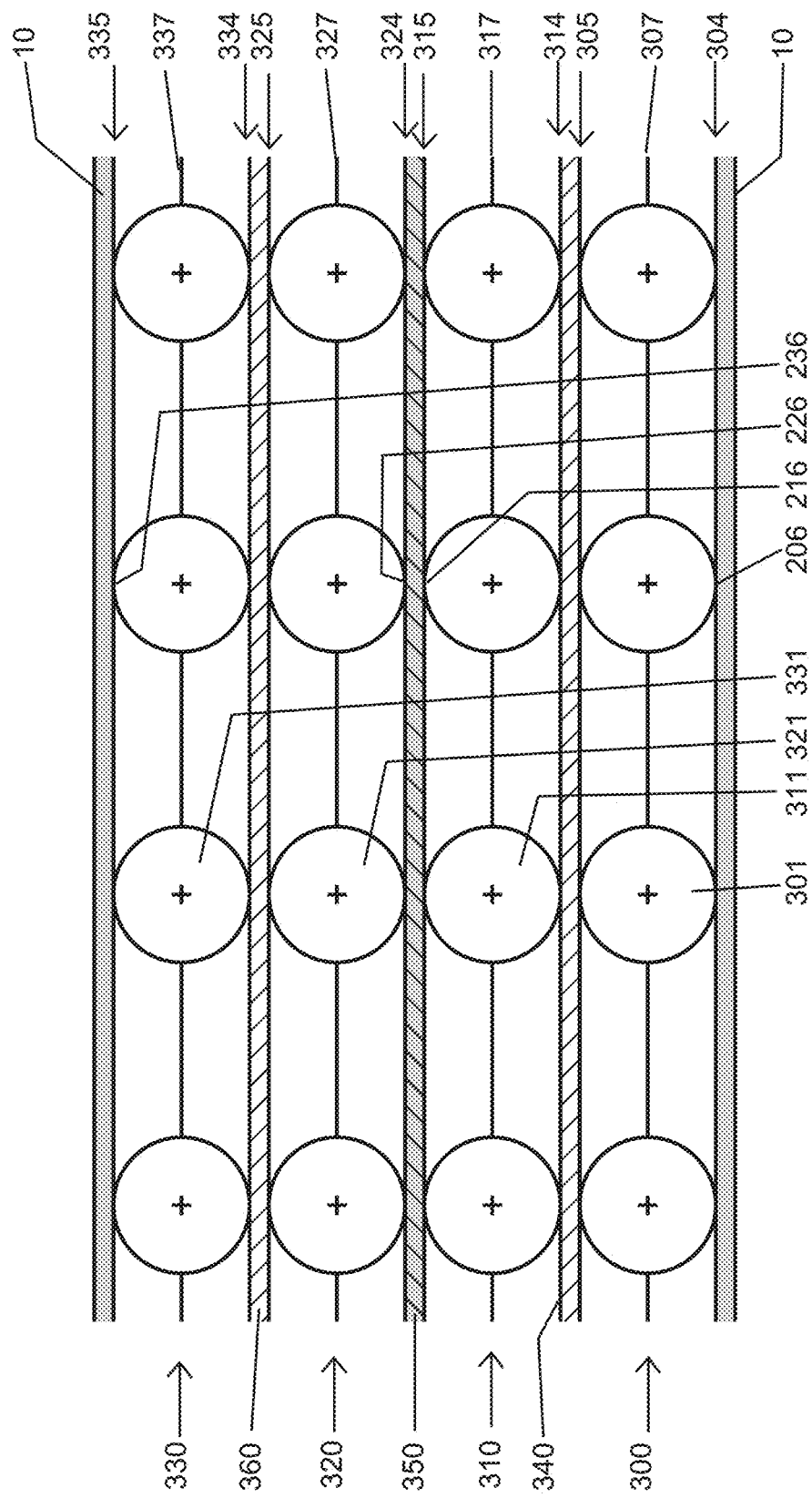
FIG. 7 schematically depicts a third embodiment of an insulation covering of an assembly according to the invention.

As shown in very schematic cross-section in FIGS. 6 and 7, the insulation covering 8 and/or insulation covering 9 may also comprise multiple layers of spheres, separated by intermediate plates.

FIG. 6 shows two layers 200, 210 of spheres 201 and 211, respectively. The spheres 201 in the layer 200 may be maintained in position by a spacer plate 207 and the spheres 211 in the layer 210 may be maintained in position by a spacer plate 217. The two layers 200 and 210 of spheres 201 and 211 may be separated by an intermediate layer 240. This configuration provides a total of four layers 204, 205, 214 and 215 of point contacts 206 and 216. By using spheres of smaller diameter, the thickness of the insulation covering of FIG. 6 can still be maintained at or below the 9 mm thickness as mentioned in relation to FIG. 4.

FIG. 7 shows four layers 300, 310, 320, 330 of spheres 301, 311, 321 and 331, respectively. The spheres 301 in the layer 300 may be maintained in position by a spacer plate 307, the spheres 311 in the layer 310 may be maintained in position by a spacer plate 317, the spheres 321 in the layer 320 may be maintained in position by a spacer plate 327, and the spheres 331 in the layer 330 may be maintained in position by a spacer plate 337. The two layers 300 and 310 of spheres 301 and 311 may be separated by an intermediate layer 340, the two layers 310 and 320 of spheres 311 and 321 may be separated by an intermediate layer 350, and the two layers 320 and 330 of spheres 321 and 331 may be separated by an intermediate layer 360. This configuration provides a total of eight layers 304, 305, 314, 315, 324, 325, 334 and 335 of point contacts 206, 216, 226 and 236. By using spheres of smaller diameter, the thickness of the insulation covering of FIG. 7 can still be maintained at or below the 9 mm thickness as mentioned in relation to FIG. 4.

Figure 8:
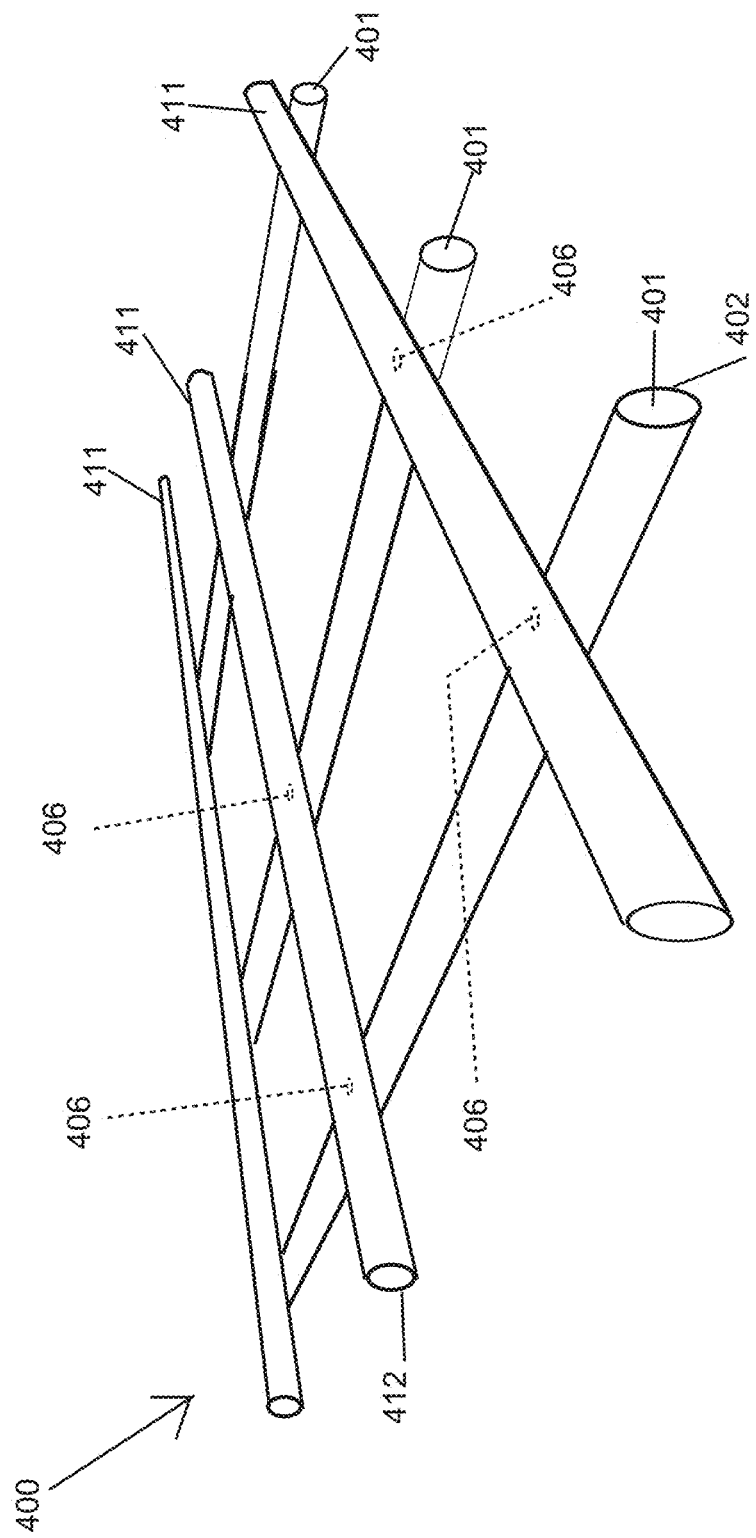
FIG. 8 schematically depicts a detail of a fourth embodiment of an insulation covering of an assembly according to the invention.

As shown in very schematic perspective view in FIG. 8, an insulation system providing at least one layer of point contacts can also be obtained with cross-wise stacked layers of straight cylindrical bodies, like the wires 401 and 402 having a circular circumference 402 respectively 412. At the crossings of the wires 401 and 411 there will be point contacts 406, as schematically indicated at four crossings in FIG. 8. In the construction of FIG. 8, the cylindrical bodies 401, 402 of each layer being straight and the layers being crosswise stacked ensured that each possible thermal conductive path between the inner and outer plate has to pass, at some place, through at least one point contact.

The present invention can also be characterized by the following clauses:
1. An assembly comprising a cryostat and a coil layer of superconducting coils, wherein the coil layer is configured for use in or with a magnetic levitation and/or acceleration motor system of a lithographic apparatus, is flat and defines two opposing layer faces;
wherein the cryostat comprises two insulation coverings;
wherein the coil layer is arranged between the two insulation coverings and each of the two opposing layer faces is covered by one of the insulation coverings;
wherein each said insulation covering comprises:
an inner plate and an outer plate parallel to the inner plate, the inner plate being arranged between the outer plate and the coil layer, and
an insulation system arranged between the inner plate and the outer plate;
wherein the insulation system is configured to have a vacuum layer;
wherein the inner plates are configured to be cryocooled; and
wherein the insulation system of one or both said insulation coverings:
comprises, in the vacuum layer, one or more layers of at least partly circular bodies each defining an at least partly circular contour and a central axis extending through a center of the circular contour as well as perpendicular to the circular contour, the central axes of the bodies of each layer of circular bodies extending perpendicular to the inner and outer plate, and
is configured to provide at least one layer of point contacts between two said layers of circular bodies or between a said layer of circular bodies and the inner and/or outer plate.
2. Assembly according to clause 1,
wherein at least one said layer of circular bodies is a layer of spherical bodies, such as spheres or half-spheres.
3. An assembly comprising a cryostat and a coil layer of superconducting coils,
wherein the coil layer is configured for use in or with a magnetic levitation and/or acceleration motor system of a lithographic apparatus, is flat and defines two opposing layer faces;
wherein the cryostat comprises two insulation coverings;
wherein the coil layer is arranged between the two insulation coverings and each of the two opposing layer faces is covered by one of the insulation coverings;
wherein each said insulation covering comprises:
an inner plate and an outer plate parallel to the inner plate, the inner plate being arranged between the outer plate and the coil layer, and
an insulation system arranged between the inner plate and the outer plate;
wherein the insulation system is configured to have a vacuum layer;
wherein the inner plates are configured to be cryocooled; and
wherein the insulation system of one or both said insulation coverings comprises, in the vacuum layer, one or more layers of spherical bodies, such as spheres or half-spheres, at least one said layers of spherical bodies providing a layer of point contacts between the layer of spheres and the inner and/or outer plate.
4. Assembly according to clause 2 or 3,
wherein at least one said layers of spherical bodies comprises spheres and a spacer plate provided with a pattern of circular through holes for accommodating the spheres, each through hole having a diameter configured to contact a said sphere such that the spacer plate is supported by the spheres, wherein the spacer plate is arranged parallel to the inner plate and the outer plate.

5. Assembly according to clause 4,
wherein the diameter of the through holes is in the range of 70-100%, such as 90-100%, of the diameter of the spheres.

6. Assembly according to one of clauses 4-5,
wherein the spacer plate is configured to be cooled at a temperature between a temperature of the inner plate and a temperature of the outer plate.

7. Assembly according to one of clauses 4-6,
wherein the thermal expansion coefficient of the spacer plate is larger than the thermal expansion coefficient of the spheres such that when the spacer plate and spheres are cooled down a shrunk connection between the spacer plate and spheres is obtained in the through holes.

8. Assembly according to one of clauses 4-7,
wherein the spacer plate comprises aluminum or an aluminum alloy.

9. Assembly according to one of clauses 2-8, comprising a multiple of said layers of spherical bodies,
wherein between adjacent ones of said layers of spherical bodies a separation plate is arranged which provides on each side an additional layer of point contacts between the separation plate and spherical bodies.

10. Assembly according to clause 9,
wherein the separation plate is configured to be cooled at a temperature between a temperature of the inner plate and a temperature of the outer plate.

11. Assembly according to one of clauses 1-10,
wherein said one or more layers of circular bodies comprise at least one set of two layers of straight cylindrical bodies, such as cylinders and/or half-cylinders;
wherein the cylindrical bodies of a first of said two layers are arranged parallel to each other with a spacing between adjacent cylindrical bodies and the cylindrical bodies of a second of said two layers are arranged parallel to each other with a spacing between adjacent cylindrical bodies; and
wherein the first layer and second layer are stacked directly onto each other with the cylindrical bodies of the first layer crosswise with respect to the cylindrical bodies of the second layer to provide, between the cylindrical bodies of the first layer and the cylindrical bodies of the second layer, a said layer of point contacts.

12. An assembly comprising a cryostat and a coil layer of superconducting coils, wherein the coil layer is configured for use in or with a magnetic levitation and/or acceleration motor system of a lithographic apparatus, is flat and defines two opposing layer faces,
wherein the cryostat comprises two insulation coverings;
wherein the coil layer is arranged between the two insulation coverings and each of the two opposing layer faces is covered by one of the insulation coverings;
wherein each said insulation covering comprises:
an inner plate and an outer plate parallel to the inner plate, the inner plate being arranged between the outer plate and the coil layer, and
an insulation system arranged between the inner plate and the outer plate;
wherein the insulation system is configured to have a vacuum layer;
wherein the inner plates are configured to be cryocooled; and
wherein the insulation system of one or both said insulation coverings comprises, in the vacuum layer, comprises at least one set of two layers of straight cylindrical bodies, such as cylinders and/or half-cylinders;
wherein the cylindrical bodies of a first of said two layers are arranged parallel to each other with a spacing between adjacent cylindrical bodies and the cylindrical bodies of a second of said two layers are arranged parallel to each other with a spacing between adjacent cylindrical bodies; and
wherein the first layer and second layer are stacked directly onto each other with the cylindrical bodies of the first layer crosswise with respect to the cylindrical bodies of the second layer to provide, between the cylindrical bodies of the first layer and the cylindrical bodies of the second layer, a layer of point contacts.

13. Assembly according to one of clauses 11-12,
wherein the cylindrical bodies are wires.

14. Assembly according to one of the preceding clauses,
wherein the at least partly circular bodies have a diameter defined as twice a radius from a center of the circular contour to the circular contour; and
wherein the diameter is smaller than 7 mm, such as smaller than 5 mm.

15. Assembly according to clause 14,
wherein the diameter is in the range of 0.1 to 5 mm, such as in the range of 0.5 to 4 mm.

16. Assembly according to one of the preceding clauses,
wherein the point contacts, in a said layer of point contacts, are arranged with a pitch of 5-20 mm, such as a pitch of 10-15 mm.

17. Assembly according to one of the preceding clauses,
wherein one of said insulation coverings has a thickness of at most 10 mm, such as at most 7-8 mm, the thickness being defined in a direction perpendicular to the inner and outer plate.

18. Assembly according to one of the preceding clauses,
wherein the circular bodies are made from a material chosen from one or more of the group of:
zirconia, Kevlar, Kevlar composites, Kevlar fiber composites, glass, glass composites, glass fiber composites, and titanium alloys.

19. Assembly according to one of the preceding clauses,
wherein the circular bodies are made
from a material having a ratio of the Young modulus with respect to the integral of the thermal conductivity coefficient over the temperature range of 4K to 80K, which is at least 1 N/Wm, such as at least 1.5 N/Wm.

20. Assembly according to one of the preceding clauses,
further comprising a cryocooler system configured for cryocooling the inner plates to a temperature lower than 30 K, such as lower than 10 K, like in the range of 0-4 K.

21. Assembly according to one of the preceding clauses,
further comprising a vacuum system configured to provide in the insulation system a vacuum of $10^{-3}$ Pa or lower.

22. Assembly according to one of the preceding clauses,
wherein the inner and/or outer plate are made from a stainless steel alloy.

23. Assembly according to one of the preceding clauses,
wherein the coil layer is configured as a stator part of the magnetic levitation and/or acceleration motor system.

24. Assembly according to one of the preceding clauses, wherein the coil layer is configured as a mover part of the magnetic levitation and/or acceleration motor system.
25. Assembly according to one of the preceding clauses, wherein the coil layer of super conducting coils is an array of superconducting electromagnets, each electromagnet having a north-south axis extending perpendicular to the coil layer;
wherein the array of electromagnets is configured such that adjacent electromagnets have opposite polarity; and wherein the array of electromagnets is wired for direct current operation.
26. Assembly according to one of the preceding clauses, wherein the coil layer of superconducting coils is wired for alternating current operation.
27. Assembly according to one of the preceding clauses, wherein the magnetic levitation and/or acceleration motor system is a linear motor system.
28. Assembly according to one of the preceding clauses, wherein the magnetic levitation and/or acceleration motor system is a planar motor system.
29. A lithographic apparatus comprising at least one flat magnetic levitation and/or acceleration motor system provided with an assembly according to one of the preceding clauses.
30. A lithographic apparatus, comprising:
a mask support constructed to support a patterning device,
a first positioner configured to position the mask support with respect to the first positioner,
a substrate support constructed to hold a substrate,
a second positioner configured to position the substrate support with respect to the second positioner, and
a projection system configured to project a pattern imparted to a radiation beam by the patterning device onto a target position on the substrate;
wherein one or more of the following items:
the mask support,
the first positioner,
the substrate support, and
the second positioner,
are provided with an assembly according to one of the clauses 1-28.

GENERAL STATEMENTS

In accordance with the present invention, 'cryogenic cooling' or 'cooling the coil layer to a cryogenic temperature' refers to a process of cooling the coil layer to such a temperature that the coils exhibit a superconductive behavior and keeping the coils at such a temperature. As such, when cooled to such a temperature, the coils may be supplied with an electrical current, substantially without generating Ohmic losses. As will be appreciated by the skilled person, the required temperature or cooling may depend on the material or composition of the applied coils and/or the pressure conditions prevailing.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:
1. An assembly comprising:
a cryostat and a coil layer of superconducting coils,
wherein the coil layer is configured for use in or with a magnetic levitation and/or acceleration motor system of a lithographic apparatus, is flat and defines two opposing layer faces;
wherein the cryostat comprises two insulation coverings;
wherein the coil layer is arranged between the two insulation coverings and each of the two opposing layer faces is covered by one of the insulation coverings;
wherein each of the insulation covering comprises:
an inner plate and an outer plate parallel to the inner plate, the inner plate being arranged between the outer plate and the coil layer, and
an insulation system arranged between the inner plate and the outer plate;
wherein the insulation system is configured to have a vacuum layer;
wherein the inner plates are configured to be cryocooled; and wherein the insulation system of one or both of the insulation coverings comprises, in the vacuum layer, one of:
one or more layers of spherical bodies are spheres or half-spheres, and at least one of the layers of spherical bodies providing a layer of point contacts between the layer of spheres and the inner and/or the outer plate, or
at least one set of two layers of straight cylindrical bodies comprising cylinders and/or half-cylinders;
wherein the cylindrical bodies of a first of the two layers are arranged parallel to each other with a spacing between adjacent cylindrical bodies and the cylindrical bodies of a second of the two layers are arranged parallel to each other with a spacing between adjacent cylindrical bodies; and
wherein the first layer and second layer are stacked directly onto each other with the cylindrical bodies of the first layer crosswise with respect to the cylindrical bodies of the second layer to provide, between the cylindrical bodies of the first layer and the cylindrical bodies of the second layer, a layer of point contacts.

2. The assembly of claim 1, wherein the cylindrical bodies are wires.

3. The assembly of claim 1, wherein at least one of the layers of spherical bodies comprises spheres and a spacer plate provided with a pattern of through holes for accommodating the spheres, each through hole having a diameter configured to contact at least one of the spheres such that the spacer plate is supported by the at least one of the spheres, wherein the spacer plate is arranged parallel to the inner plate and the outer plate.

4. The assembly of claim 3, wherein a thermal expansion coefficient of the spacer plate is larger than the thermal expansion coefficient of the spheres such that when the spacer plate and spheres are cooled down a shrunk connection between the spacer plate and spheres is obtained in the through holes.

5. The assembly of claim 1, comprising a multiple of the layers of spherical bodies, wherein between adjacent ones of the layers of spherical bodies, a separation plate is arranged that provides, on each side, an additional layer of point contacts between the separation plate and spherical bodies.

6. The assembly of claim 5, wherein the separation plate is configured to be cooled at a temperature between a temperature of the inner plate and a temperature of the outer plate.

7. The assembly of claim 1, wherein the cylindrical bodies have a diameter defined as twice a radius from a center of a cylindrical contour to the cylindrical contour; and wherein the diameter is smaller than 7 mm, or smaller than 5 mm.

8. The assembly of claim 1, wherein the point contacts, in the layer of point contacts, are arranged with a pitch of 5-20 mm, or a pitch of 10-15 mm.

9. The assembly of claim 1, wherein one of the insulation coverings has a thickness of at most 10 mm, or at most 7-8 mm, the thickness being defined in a direction perpendicular to the inner and outer plate.

10. The assembly of claim 1, wherein the spherical bodies are made from a material chosen from one or more of the group of: zirconia, Kevlar, Kevlar composites, Kevlar fiber composites, glass, glass composites, glass fiber composites, and titanium alloys.

11. The assembly of claim 1, wherein the spherical bodies are made from a material having a ratio of the Young modulus with respect to the integral of the thermal conductivity coefficient over the temperature range of 4 K to 80 K, that is at least 1 N/Wm, or at least 1.5 N/Wm.

12. The assembly of claim 1, further comprising a cryocooler system configured for cryocooling the inner plates to a temperature lower than 30 K, or lower than 10 K, or in the range of 0-4 K.

13. The assembly of claim 1, wherein the inner and/or outer plate are made from a stainless steel alloy.

14. The assembly of claim 1, wherein the coil layer is configured as a stator part of the magnetic levitation motor system.

15. The assembly of claim 1, wherein the coil layer is configured as a stator part of the acceleration motor system.

16. The assembly of claim 1, wherein the coil layer is configured as a mover part of the magnetic levitation motor system.

17. The assembly of claim 1, wherein the coil layer is configured as a mover part of the acceleration motor system.

18. The assembly of claim 1, wherein the coil layer of superconducting coils is an array of superconducting electromagnets, each electromagnet having a north-south axis extending perpendicular to the coil layer;
wherein the array of superconducting electromagnets is configured such that adjacent electromagnets have opposite polarity; and
wherein the array of superconducting electromagnets is wired for direct current operation.

19. The assembly of claim 18, wherein the array of superconducting electromagnets is configured such that adjacent electromagnets have opposite polarity.

20. A lithographic apparatus, comprising:
a mask support constructed to support a patterning device,
a first positioner configured to position the mask support with respect to the first positioner,
a substrate support constructed to hold a substrate,
a second positioner configured to position the substrate support with respect to the second positioner, and
a projection system configured to project a pattern imparted to a radiation beam by the patterning device onto a target position on the substrate;
wherein one or more of the following items:
the mask support,
the first positioner,
the substrate support,
and the second positioner,
are provided with the assembly of claim 1.

* * * * *